United States Patent
Kim et al.

(10) Patent No.: US 10,523,188 B2
(45) Date of Patent: Dec. 31, 2019

(54) SEMICONDUCTOR DEVICE

(71) Applicant: SAMSUNG ELECTRONICS CO., LTD., Suwon-si (KR)

(72) Inventors: Ji Kyum Kim, Seongnam-si (KR); Dae Seong Lee, Busan (KR); Min Su Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 132 days.

(21) Appl. No.: 15/427,444

(22) Filed: Feb. 8, 2017

(65) Prior Publication Data

US 2017/0244394 A1 Aug. 24, 2017

Related U.S. Application Data

(60) Provisional application No. 62/298,646, filed on Feb. 23, 2016.

(30) Foreign Application Priority Data

Jun. 30, 2016 (KR) .................. 10-2016-0082635

(51) Int. Cl.
*H03K 3/00* (2006.01)
*H03K 3/356* (2006.01)
*H01L 27/02* (2006.01)
*H01L 27/092* (2006.01)
*H01L 23/528* (2006.01)
*H01L 27/105* (2006.01)

(52) U.S. Cl.
CPC ..... *H03K 3/356156* (2013.01); *H01L 23/528* (2013.01); *H01L 27/0207* (2013.01); *H01L 27/092* (2013.01); *H01L 27/1052* (2013.01)

(58) Field of Classification Search
CPC .............................. H03K 3/356156
USPC .......................................... 327/211
See application file for complete search history.

(56) References Cited

U.S. PATENT DOCUMENTS

| | | | |
|---|---|---|---|
| 5,160,995 A | 11/1992 | Wada et al. |
| 6,445,214 B2 | 9/2002 | Sasaki et al. |
| 7,235,855 B2 | 6/2007 | Satomi |
| 7,737,472 B2 | 6/2010 | Kondo et al. |
| | (Continued) | | |

FOREIGN PATENT DOCUMENTS

| | | |
|---|---|---|
| JP | 10-303306 A | 11/1998 |
| JP | 2005-322694 A | 11/2005 |
| | (Continued) | |

*Primary Examiner* — Metasebia T Retebo
(74) *Attorney, Agent, or Firm* — Sughrue Mion, PLLC

(57) ABSTRACT

A semiconductor device includes: first through fourth active regions spaced apart from one another; a first gate line disposed to overlap with the first and second active regions, but not with the third and fourth active regions, and to extend in a first direction; a second gate line disposed to overlap with the third and fourth active regions, but not with the first and second active regions, and to extend in the first direction while being spaced apart from the first gate line; and a dummy gate line disposed to overlap with the first through fourth active regions and a field region, to be spaced apart from the first and second gate lines in a second direction, and to extend in the first direction, wherein a signal input to the first or second active region is transmitted to the third or fourth active region.

20 Claims, 10 Drawing Sheets

(56) References Cited

U.S. PATENT DOCUMENTS

| | | | |
|---|---|---|---|
| 8,056,042 B2 | 11/2011 | Miyagawa | |
| 8,174,052 B2 | 5/2012 | Kim et al. | |
| 9,142,556 B2 | 9/2015 | Kito | |
| 2012/0286837 A1* | 11/2012 | Tomita | H01L 27/0207 327/203 |
| 2014/0097493 A1* | 4/2014 | Baek | H01L 27/1211 257/347 |
| 2015/0091188 A1 | 4/2015 | Lee et al. | |

FOREIGN PATENT DOCUMENTS

| | | |
|---|---|---|
| JP | 2005-340461 A | 12/2005 |
| JP | 2012-64816 A | 3/2012 |

\* cited by examiner

SEMICONDUCTOR DEVICE

CROSS-REFERENCE TO THE RELATED APPLICATIONS

This application claims priority from U.S. Provisional Application No. 62/298,646 filed on Feb. 23, 2016 in the U.S. Patent and Trademark Office and Korean Patent Application No. 10-2016-0082635 filed on Jun. 30, 2016 in the Korean Intellectual Property Office, the disclosures of which are incorporated herein by reference in their entirety.

BACKGROUND

1. Field

Apparatuses and methods consistent with the example embodiments of the inventive concept to a semiconductor device, and more particularly, to a semiconductor device using a dummy gate structure formed in a field region as a routing channel.

2. Description of the Related Art

In accordance with demands from the electronics industry, semiconductor devices have increasingly become compact in size and weight and multi-functionalized to lower the manufacturing costs. Semiconductor devices may be classified into a semiconductor memory device for storing logic data, a semiconductor logic device for computing logic data, and a hybrid semiconductor device, which includes both a memory element and a logic element.

As the electronic industry develops, demands for various characteristics of semiconductor devices have grown. To meet those demands, semiconductor devices have become more and more sophisticated and highly integrated.

Accordingly, the height and the critical poly-pitch (CPP) of standard cells have decreased. However, since the rate of decrease of back-end-of-line (BEOL) is relatively low, congestion may be exacerbated between BEOL wires.

SUMMARY

Example embodiments of the inventive concept provide a semiconductor device using, as a routing channel, a dummy gate line disposed in a field region, among the gate lines formed on a chip level, to address routing congestion.

However, example embodiments of the inventive concept are not restricted to those set forth herein. The above and other example embodiments of the inventive concept will become more apparent to one of ordinary skill in the art to which the inventive concept pertains by referencing the detailed description of the embodiments given below.

According to an example embodiment of the inventive concept, there is provided a semiconductor device which may include: first through fourth active regions spaced apart from one another; a first gate line disposed to overlap with the first and second active regions, but not with the third and fourth active regions, and to extend in a first direction; a second gate line disposed to overlap with the third and fourth active regions, but not with the first and second active regions, and to extend in the first direction while being spaced apart from the first gate line; and a dummy gate line disposed to overlap with the first through fourth active regions and a field region, to be spaced apart from the first and second gate lines in a second direction, and to extend in the first direction, wherein a signal input to the first or second active region is transmitted to the third or fourth active region.

According to another example embodiment of the inventive concept, there is provided a semiconductor device which may include: a first buffer including a first N-type metal oxide semiconductor (NMOS) transistor and a first P-type metal oxide semiconductor (PMOS) transistor; a second buffer including a second NMOS transistor and a second PMOS transistor; and a dummy gate line electrically connecting an output terminal of the first buffer and an input terminal of the second buffer, wherein a first signal output from the output terminal of the first buffer is input to the input terminal of the second buffer via the dummy gate line, and the first NMOS transistor, the first PMOS transistor, the second NMOS transistor, the second PMOS transistor, and the dummy gate line are formed to be in contact with a top surface of a substrate.

According to still another example embodiment of the inventive concept, there is provided a semiconductor device which may include: a first flipflop circuit including a first standard cell having a first height; a second flipflop circuit including a second standard cell having a second height; and a dummy gate line electrically connecting the first flipflop circuit and the second flipflop circuit, wherein a first signal output from the first flipflop circuit is input to the second flipflop circuit via the dummy gate line, and the dummy gate line, transistors included in the first flipflop circuit, and transistors included in the second flipflop circuit are arranged in a single layer formed horizontally on a top surface of a substrate.

According to yet another example embodiment of the inventive concept, there is provided a semiconductor device which may include: a plurality of active regions each of which includes at least one transistor; and a dummy gate line which does not form a transistor, and connects a first active region and a second active region of the active regions so that a signal output from the first active region is input to the second active region through the gate line, wherein the gate line is formed in or abut onto a field region which separates the active regions from one another.

Other features and aspects will be apparent from the following detailed description, the drawings, and the claims.

DETAILED DESCRIPTION

Figure 1:
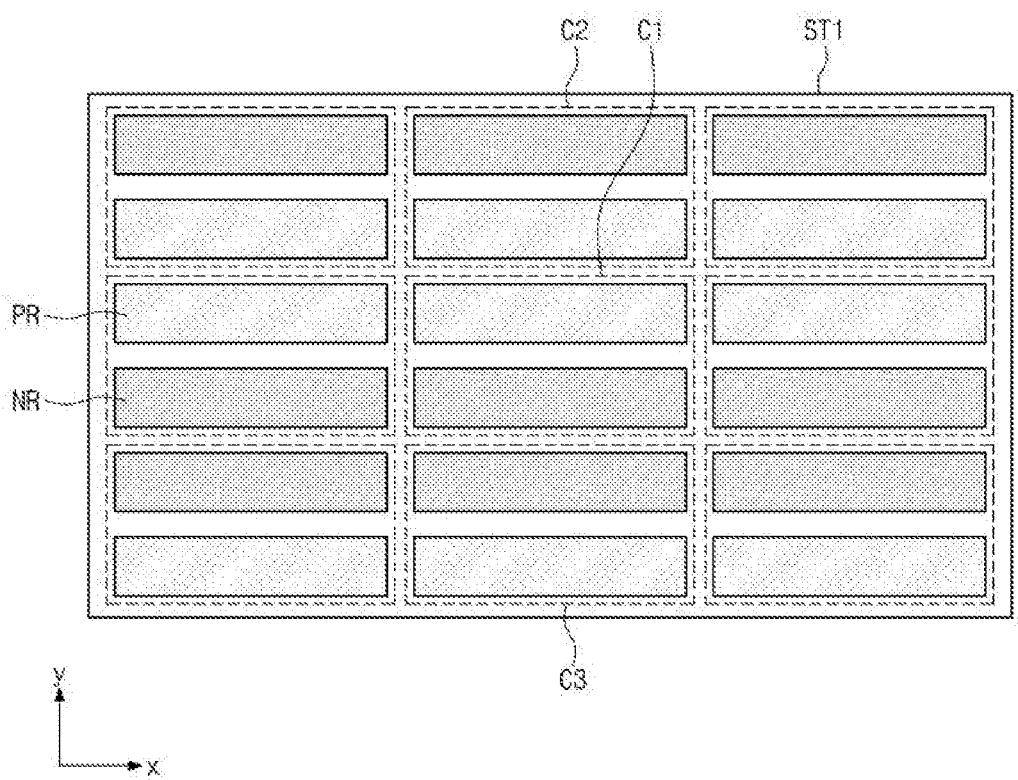
FIG. 1 is a plan view of a semiconductor device according to an example embodiment of the inventive concept.
Figure 2:
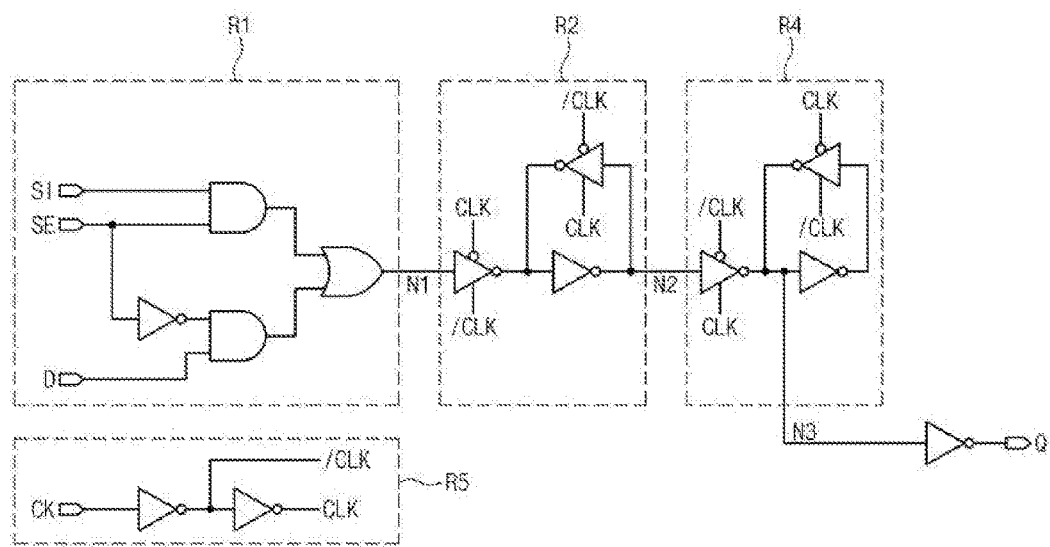
FIG. 2 is a logic circuit diagram of a flipflop circuit according to an example embodiment of the inventive concept.
Figure 3:
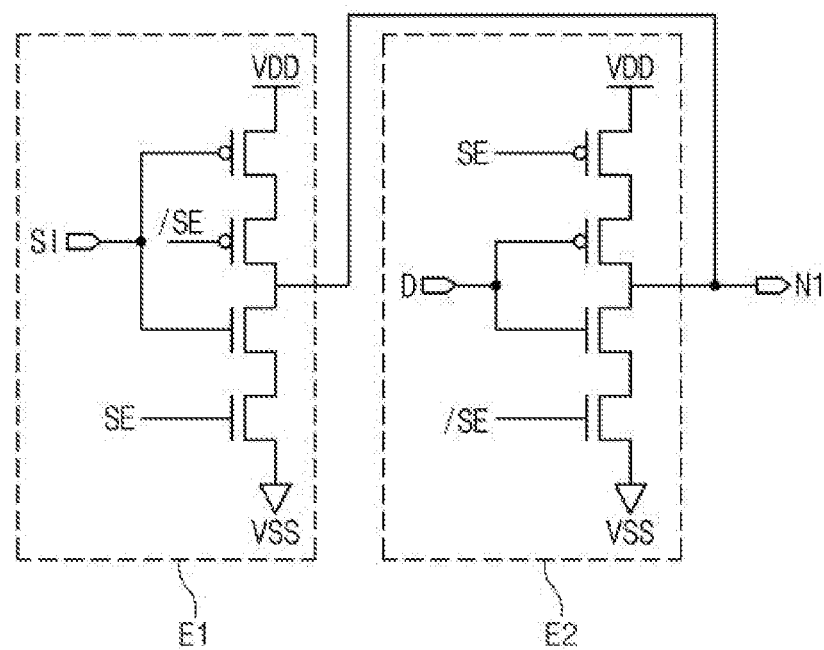
FIG. 3 is an equivalent circuit diagram of a first region of FIG. 2, according to an example embodiment of the inventive concept.
Figure 4:
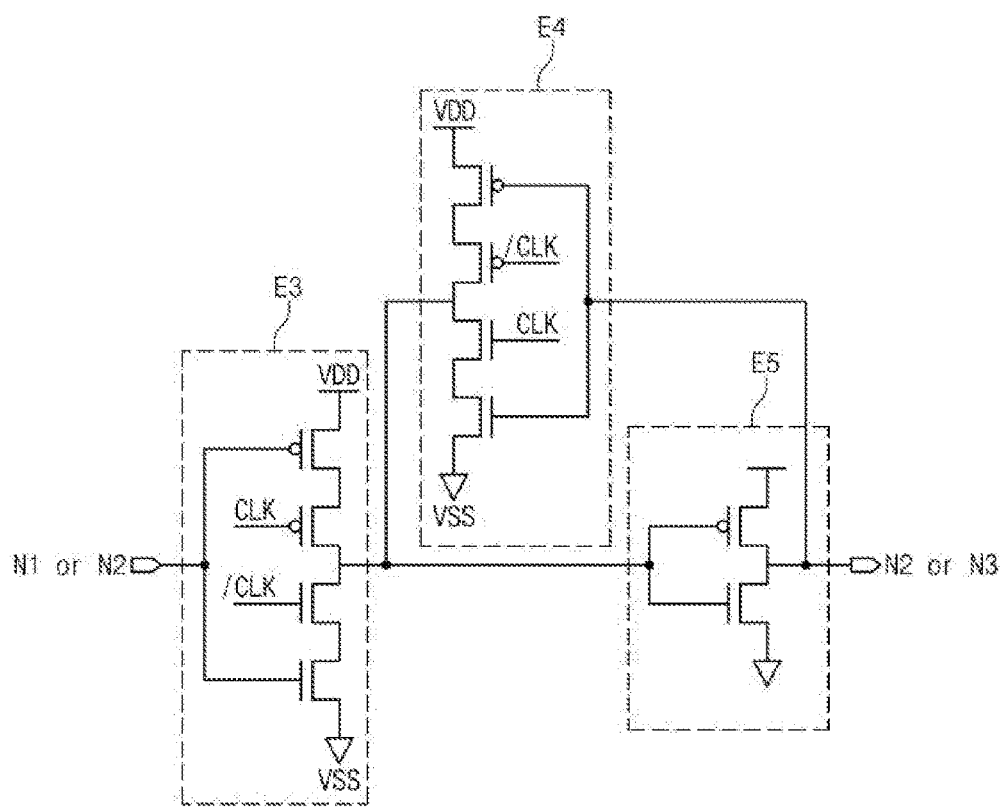
FIG. 4 is an equivalent circuit diagram of a second region or a fourth region of FIG. 2, according to an example embodiment of the inventive concept.

FIG. 1 is a plan view of a semiconductor device according to an example embodiment of the inventive concept. FIG. 2 is a logic circuit diagram of a flipflop circuit according to an example embodiment of the inventive concept. FIG. 3 is an equivalent circuit diagram of a first region of FIG. 2, according to an example embodiment of the inventive concept. FIG. 4 is an equivalent circuit diagram of a second region or a fourth region of FIG. 2, according to an example embodiment of the inventive concept.

Referring to FIG. 1, a semiconductor according to an example embodiment may include a plurality of logic cells. A logic cell may be a unit in which a single logic operation is performed. Each of the logic cells may include a plurality of transistors.

For example, the semiconductor device according to the present example embodiment may include first to third logic cells C1, C2, and C3, which are spaced apart one another in a direction y with the first logic cell C1 disposed between the second and third. Each of the first, second, and third logic cells C1, C2, and C3 may include active regions that are separated from one another by a first device isolation layer ST1.

For example, each of the first, second, and third logic cells C1, C2, and C3 may include a P-type metal oxide semiconductor (PMOS) transistor region PR and an N-type metal oxide semiconductor (NMOS) transistor region NR. The PMOS transistor region PR and the NMOS transistor region NR of each of the first, second, and third logic cells C1, C2, and C3 may be separated from each other by the first device isolation layer ST1. The structure of the first, second, and third logic cells C1, C2, and C3 will hereinafter be described, taking the first logic cell C1 as an example, but it will be understood that the structure of the second and third logic cells C2 and C3 is the same as, substantially similar to, or at least equivalent to, the structure of the first logic cell C1. FIG. 1 illustrates a total of nine logic cells, but the inventive concept is not limited thereto.

Referring to FIGS. 2 and 3, a first region R1 may include a first element E1 to which a scan input signal SI is input, and a second element E2 to which an external input signal D is input. The first element E1 may include four transistors connected in series, i.e., first through fourth transistors sequentially arranged between a power supply voltage VDD and a ground voltage VSS. The first and second transistors of the first element E1 may be PMOS transistors, and the third and fourth transistors of the first element E1 may be NMOS transistors.

The scan input signal SI may be input to the first and third transistors of the first element E1, a scan enable inversion signal /SE may be input to the second transistor of the first element E1, and the scan enable signal SE may be input to the fourth transistor of the first element E1.

The second element E2 may include four transistors connected in series, i.e., first through fourth transistors sequentially arranged between the power supply voltage VDD and the ground voltage VSS. The first and second transistors of the second element E2 may be PMOS transistors, and the third and fourth transistors of the second element E2 may be NMOS transistors.

The external input signal D may be input to the second and third transistors of the second element E2, a scan enable signal SE may be input to the first transistor of the second element E2, and a scan enable inversion signal /SE may be input to the fourth transistor of the second element E2.

The first and second elements E1 and E2 of the first region R1 may be connected in parallel to a first node N1.

Referring to FIGS. 2 and 4, a second region R2 includes third, fourth, and fifth elements E3, E4, and E5, which are arranged between the first node N1 and a second node N2. A clock signal CLK and a clock inversion signal /CLK may be input to the third and fourth elements E3 and E4, respectively.

A fourth region R4 may have the same elements as the second region R2, i.e., third, fourth, and fifth elements E3, E4, and E5, and may have the same structure as the second region R2 except that the third, fourth, and fifth elements E3, E4, and E5 of the fourth region R4 are arranged between the second node N2 and a third node N3. The second region R2 will hereinafter be described in further detail, and the description of the second region R2 may directly apply to the fourth region R4.

The fourth and fifth elements E4 and E5 may be connected in parallel between the third element E3 and the second node N2. The third element E3 includes four transistors connected in series, i.e., first through fourth transistors sequentially arranged between the power supply voltage VDD and the ground voltage VSS. The first and second transistors of the third element E3 may be PMOS transistors, and the third and fourth transistors of the third element E3 may be NMOS transistors.

A signal from the first node N1 may be input to the first and fourth transistors of the third element E3. The clock signal CLK may be input to the second transistor of the third element E3, and the clock inversion signal /CLK may be input to the third transistor of the third element E3.

The fourth element E4 includes four transistors connected in series, i.e., first through fourth transistors sequentially arranged between the power supply voltage VDD and the ground voltage VSS. The first and second transistors of the fourth element E4 may be PMOS transistors, and the third and fourth transistors of the fourth element E4 may be NMOS transistors.

The first and fourth transistors of the fourth element E4 may be connected to the second node N2. The clock inversion signal /CLK may be input to the second transistor of the fourth element E4, and the clock signal CLK may be input to the third transistor of the fourth element E4.

Table 1 below is a timing table of a flipflop circuit included in the semiconductor device, according to the present example embodiment.

TABLE 1

| D[n] | SI | SE | CK | Q[n + 1] |
|------|----|----|----|----------|
| 1 | x | 0 | Low→High | 1 |
| 0 | x | 0 | Low→High | 0 |
| x | x | x | High→Low | Q[n] |
| x | 1 | 1 | Low→High | 1 |
| x | 0 | 1 | Low→High | 0 |

In a case in which an external input signal D[n] is logic high and the scan enable signal SE is inactive, an external output signal Q[n+1] becomes logic high in response to a low-to-high transition of an external clock signal CK.

In a case in which the external input signal D[n] is logic low and the scan enable signal SE is inactive, the external output signal Q[n+1] becomes logic low in response to the low-to-high transition of the external clock signal CK.

In a case in which none of the external input signal D[n], the scan enable signal SE, and the scan input signal SI exist, the external output signal Q[n+1] is maintained at the same level as an external output signal Q[n] from a previous cycle in response to a high-to-low transition of the external clock signal CK.

In a case in which the external input signal D[n] does not exist and the scan enable signal SE and the scan input signal SI are both active, the external output signal Q[n+1] becomes logic high in response to the low-to-high transition of the external clock signal CK.

In a case in which the external input signal D[n] does not exist, the scan enable signal SE is active, and the scan input signal SI is inactive, the external output signal Q[n+1] becomes logic low in response to the low-to-high transition of the external clock signal CK.

Figure 5:
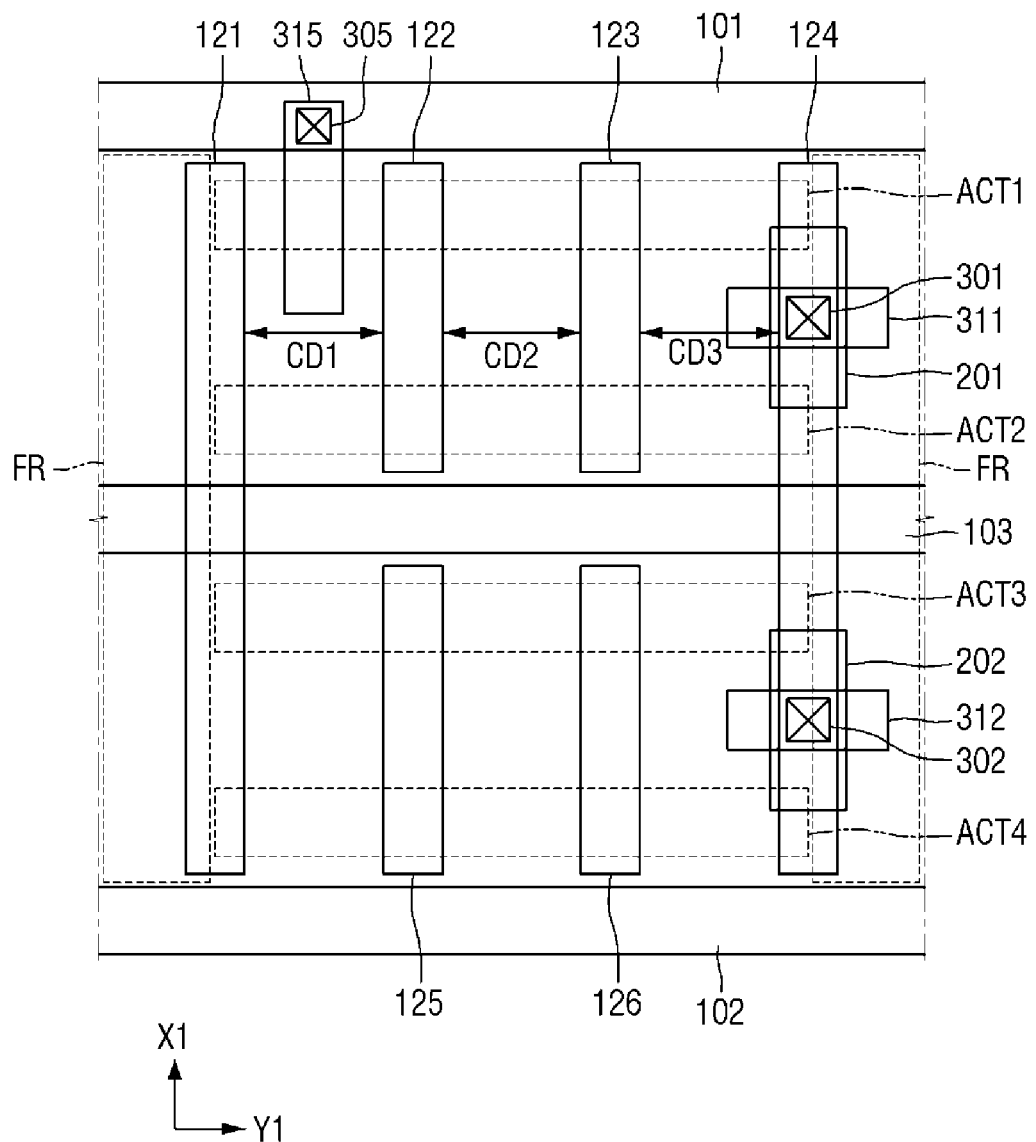
FIG. 5 is a layout view of a semiconductor device according to an example embodiment of the inventive concept inventive concept.

FIG. 5 is a layout view of a semiconductor device according to an example embodiment of the inventive concept. The layout illustrated in FIG. 5 may be only a portion of the semiconductor device according to the present example embodiment.

Referring to FIG. 5, the semiconductor device according to the present example embodiment includes first through third power rails 101 through 103, first through fourth active regions ACT1 through ACT4, first through sixth gate lines 121 through 126, first wiring lines 201 and 202, first contact structures 301 and 302, second wiring lines 311 and 312, a second contact structure 305, and a first active region connecting structure 315.

According to the present example embodiment, the fourth gate line 124, which is a dummy gate line, serves as a routing channel for transmitting signals between the transistors disposed in the first through fourth active regions ACT1 through ACT4. The fourth gate line 124 may overlap with the first through fourth active regions ACT1 through ACT4, and may also overlap with a field region FR, but the inventive concept is not limited thereto. That is, the fourth gate line 124 may be formed at a side of the field region FR to be spaced apart from the field region FR. According to the present example embodiment, the fourth gate line 124 corresponds to a dummy gate line that does not form transistors, and whether to form the fourth gate line 124 to overlap with the field region FR may vary depending on a manufacturing or operating environment. That is the fourth gate line 124 may be disposed in or abut onto the field region FR, according to another example embodiment.

Since the layout illustrated in FIG. 5 may be only a portion of the semiconductor device according to the present example embodiment, one or more active regions may be formed outside the field region FR on the semiconductor device. For example, an active region which is isolated or separated by the field region FR overlapping the fourth gate line 124 may be disposed on a right side of the active region ACT1. This active region may take a form similar to the active region ACT1, that is, extending in a second direction Y1.

According to the present example embodiment, a routing channel for transmitting signals can be formed using a dummy gate line without a requirement of an additional wiring line (for example, a wiring line on an "M3" level). Thus, routing congestion on a back-end-of-line (BEOL) level can be addressed.

In addition, the process and structure for BEOL connection can be simplified.

The first through fourth active regions ACT1 through ACT4 may be spaced apart from one another. More specifically, the first through fourth active regions ACT1 through ACT4 may be formed along a first direction X1 to be spaced apart from one another.

The first and fourth active regions ACT1 and ACT4 may include a P- or N-type impurity doped region. The second and third active regions ACT2 and ACT3 may include an N- or P-type impurity doped region. Also, source or drain regions may be formed in the first through fourth active regions ACT1 through ACT4. That is, PMOS or NMOS transistors may be formed in the first and fourth active regions ACT1 and ACT4, and NMOS or PMOS transistors may be formed in the second and third active regions ACT2 and ACT3. For example, when at least one PMOS transistor is formed in each of the first and fourth active regions ACT1 and ACT4, at least one NMOS transistor may be formed in each of the second and third active regions ACT2 and ACT3.

The first through sixth gate lines 121 through 126 may extend in the first direction X1. The second and third gate lines 122 and 123 may be disposed to overlap with the first and second active regions ACT1 and ACT2, but not with the third and fourth active regions ACT3 and ACT4.

The second and third gate lines 122 and 123 may include metal gate lines, and may form PMOS or NMOS transistors.

The fifth and sixth gate lines 125 and 126 may be disposed to overlap with the third and fourth active regions ACT3 and ACT4, but not with the first and second active regions ACT1 and ACT2.

The fifth and sixth gate lines 125 and 126 may include metal gate lines, and may form NMOS or PMOS transistors.

For example, when each of the second and third gate lines 122 and 123 forms a PMOS transistor, each of the fifth and sixth gate lines 125 and 126 may form an NMOS transistor The second and fifth gate lines 122 and 125 may be obtained by cutting a single gate line, and the third and sixth gate lines 123 and 126 may be obtained by cutting another single gate line. A gate cut region may be formed to extend in the second direction Y1. Due to the gate cut region, the second and fifth gate lines 122 and 125 may be separated from each other, and the third and sixth gate lines 123 and 126 may also be separated from each other.

The first and fourth gate lines 121 and 124 may be dummy gate lines. More specifically, the first and fourth gate lines 121 and 124 may be dummy gate lines disposed on or near the field region FR where no transistors are formed. According to the present example embodiment, since the fourth gate line 124, among other dummy gate lines, is used as a routing channel, a routing channel can be formed without a requirement of an additional wiring process.

In addition, since the first through sixth gate lines 121 through 126 are included in or disposed on a single layer formed horizontally on a top or bottom surface of a substrate, routing congestion or complexity during a BEOL process can be addressed. The phrase "the first through sixth gate lines 121 through 126 are included in or disposed on a single layer," as used herein, means that the first through sixth gate lines 121 through 126 can be formed to be in contact with the top or bottom surface of the substrate regardless of an order in which the first through sixth gate lines 121 through 126 are formed.

The formation of gate lines generally involves repeating deposition of a material on a substrate and etching of the material, and a dummy gate line that does not form at least one transistor, among other gate lines, may be used as a routing channel for transmitting signals.

More specifically, the fourth gate line 124 may be a routing channel for transmitting signals between at least one transistor formed on the first active region ACT1 and/or the second active region ACT2 and at least one transistor formed on the third active region ACT3 and/or the fourth active region ACT4. It will be understood that the expression "and/or," as used herein, refers to and encompasses any and all possible combinations of one or more of the associated listed items. Here, according to an example embodiment, the first active region ACT1 and/or the second active region ACT2 may constitute at least one buffer element of a flipflop circuit formed on the semiconductor device of FIG. 5, and the third active region ACT3 and/or the fourth active region ACT4 may constitute at least one buffer element of another flipflop circuit formed on the semiconductor device of FIG. 5.

The first contact structure 301 may be formed on the fourth gate line 124, and the first wiring line 201 may be formed on the first contact structure 301. The first wiring line 201 may be electrically connected to the second wiring line 311 via an additional contact structure.

Also, the first contact structure 302 may be formed on the fourth gate line 124, and the first wiring line 202 may be formed on the first contact structure 301. The first wiring line 202 may be electrically connected to the second wiring line 312 via an additional contact structure.

For example, the first contact structure 301 and the first wiring line 201 may serve as input pins. The first contact structure 302 and the first wiring line 202 may serve as output pins. A signal transmitted from the transistor formed on the first active region ACT1 and/or the second active region ACT2 may be delivered to the transistor formed on the third active region ACT3 and/or the fourth active region ACT4 via the fourth gate line 124. More specifically, the scan input signal SI may be transmitted from the transistor formed on the first active region ACT1 and/or the second active region ACT2 to the transistor formed on the third active region ACT3 and/or the fourth active region ACT4 via the fourth gate line 124.

The first active region connecting structure 315 may be formed on the first active region ACT1, and the second contact structure 305 may be formed on the first active region connecting structure 315. The second contact structure 305 may be electrically connected to the first power rail 101, which is formed on an "M1" level, and may thus be supplied with power by the first power rail 101.

For example, the first power rail 101 is a power supply voltage rail, and the third power rail 103 may be a ground voltage rail. In an alternative example, the third power rail 103 may be a power supply voltage rail, and the second power rail 102 may be a ground voltage rail. However, the inventive concept is not limited to these examples. That is, a power supply voltage rail and a ground voltage rail may be formed in various manners without departing from the spirit of the inventive concept. The first active region ACT1 may include a P-type impurity doped region, and the second active region ACT2 may include an N-type impurity doped region.

In some example embodiments of the inventive concept, a pitch CD1 between the first and second gate lines 121 and 122, a pitch CD2 between the second and third gate lines 122 and 123, and a pitch CD3 between the third and fourth gate lines 123 and 124 may all be identical. That is, the first through fourth gate lines 121 through 124 can be formed to keep substantially the same distance from one another because the first through sixth gate lines 121 through 126 are formed by a same process and then by forming the gate cut region in a subsequent process, the second and fifth gate lines 122 and 125 are separated from each other and the third and sixth gate lines 123 and 126 are separated from each other.

Accordingly, the first through sixth gate lines 121 through 126 may all include metal gate lines.

The pitch CD3 between the third and fourth gate lines 123 and 124 may be substantially the same as the pitch between the sixth and fourth gate lines 126 and 124.

According to some example embodiments of the inventive concept, the first contact structures 301 and 302 and the second contact structure 305 may comprise copper (Cu) or tungsten (W).

Figure 6:
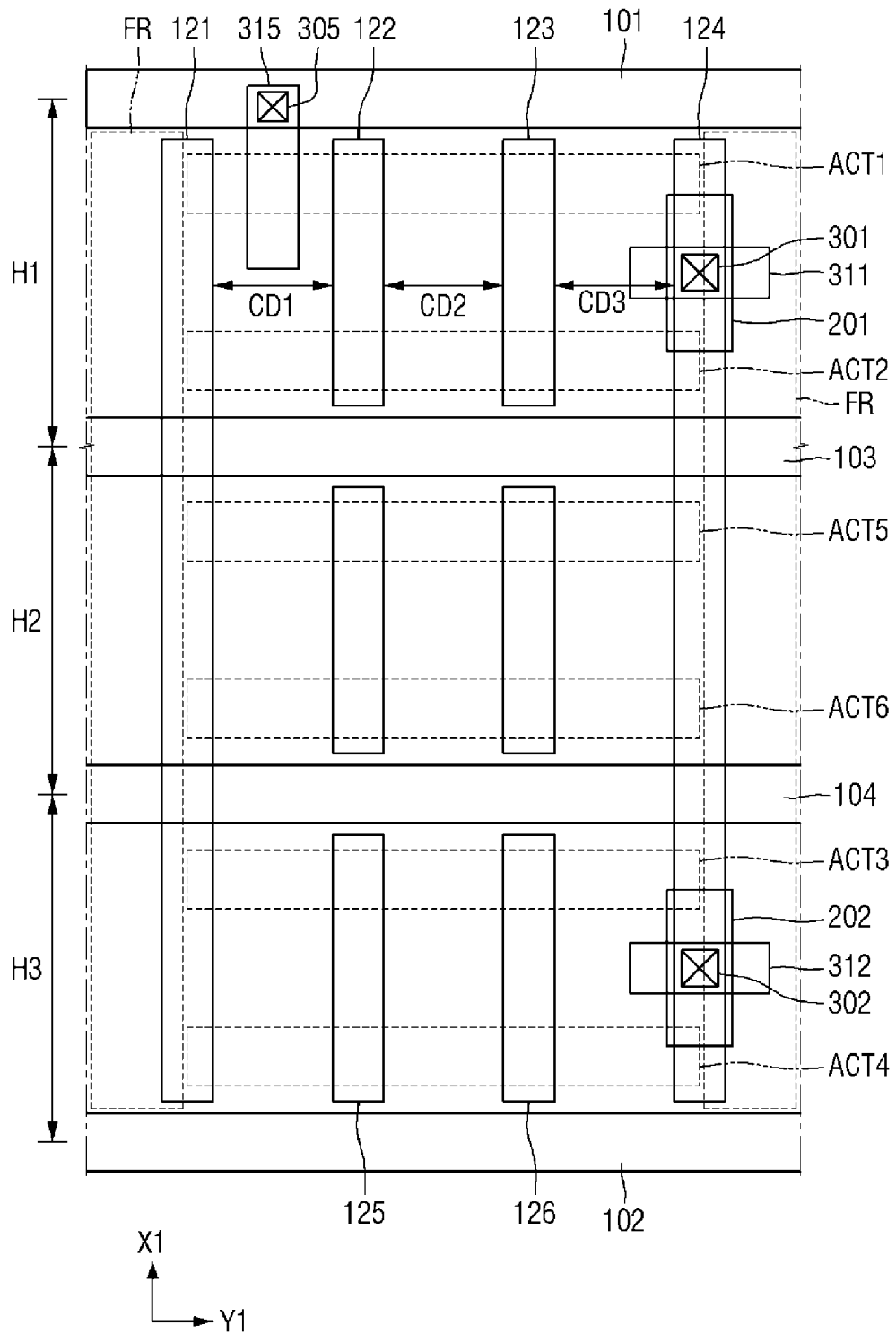
FIG. 6 is a layout view of a semiconductor device according to an example embodiment of the inventive concept inventive concept.

FIG. 6 is a layout view of a semiconductor device according to an example embodiment of the inventive concept. The layout illustrated in FIG. 6 may be only a portion of the semiconductor device according to the present example embodiment. The example embodiment of FIG. 6 will hereinafter be described, focusing mainly on differences with the example embodiment of FIG. 1.

Referring to FIG. 6, the semiconductor device according to the present example embodiment includes first through fourth power rails 101 through 104, first through sixth active regions ACT1 through ACT6, first through sixth gate lines 121 through 126, first wiring lines 201 and 202, first contact structures 301 and 302, second wiring lines 311 and 312, a second contact structure 305, and a first active region connecting structure 315.

FIG. 6 illustrates a semiconductor device having a multi-height standard cell. The formation of a routing channel for transmitting signals using a dummy gate line according to the inventive concept may be applicable not only to a semiconductor device having a double-height standard cell, but also to a semiconductor device having a multi-height standard cell.

FIG. 6 illustrates a semiconductor device having a triple-height standard cell as an example semiconductor device, but the inventive concept is not limited thereto. That is, the inventive concept may also be applicable to a semiconductor device having a quadruple (or more)-height standard cell.

Referring to FIG. 6, a first height H1 of a first standard cell, a second height H2 of a second standard cell, and a third height H3 of a third standard cell may all be substantially identical, but the inventive concept is not limited thereto.

Figure 7:
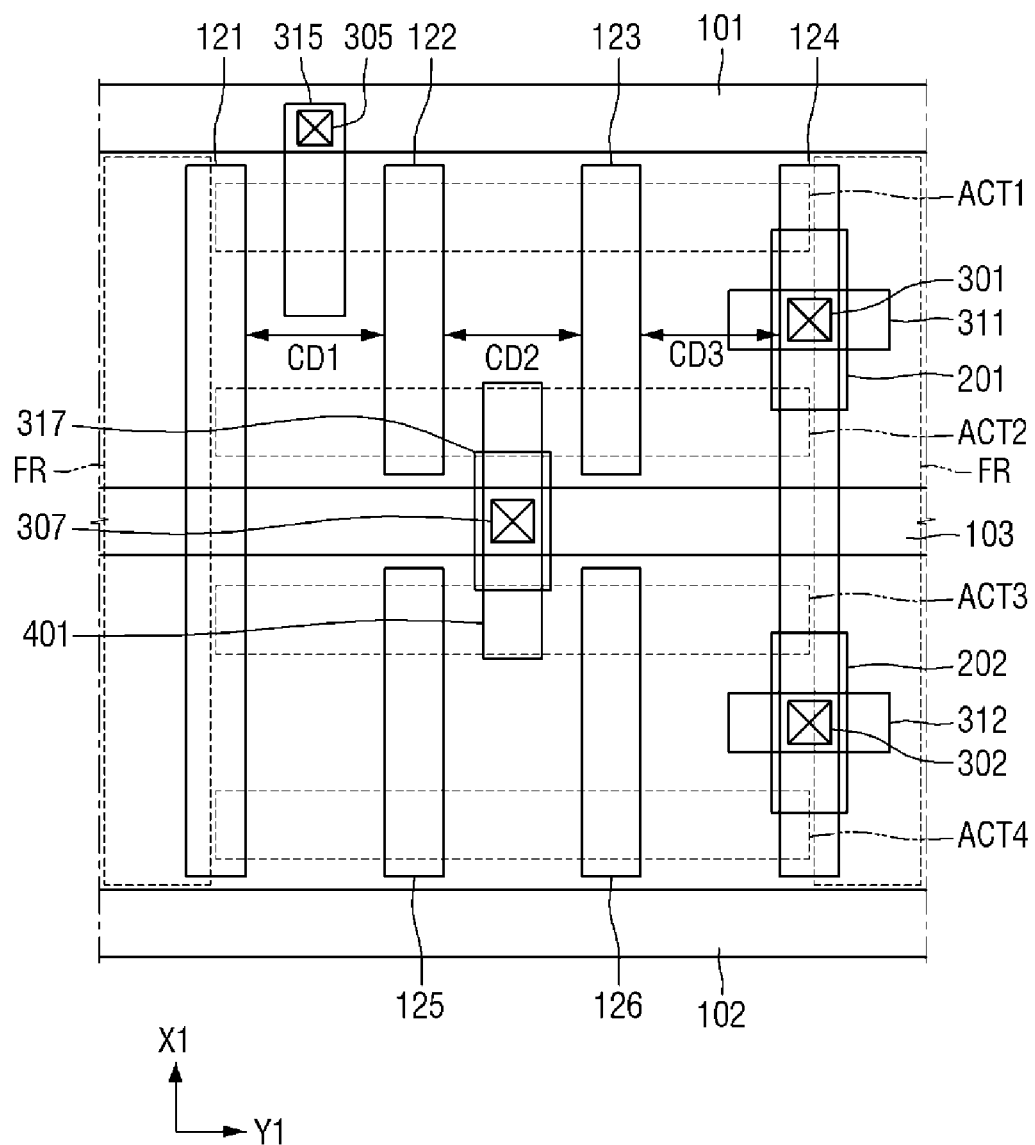
FIG. 7 is a layout view of a semiconductor device according to an example embodiment of the inventive concept.

FIG. 7 is a layout view of a semiconductor device according to an example embodiment of the inventive concept. The layout illustrated in FIG. 7 may be only a portion of the semiconductor device according to the present example embodiment. The example embodiment of FIG. 7 will hereinafter be described, focusing mainly on differences with the example embodiments of FIGS. 1 and 6.

Referring to FIG. 7, the semiconductor device according to the present example embodiment includes first through third power rails 101 through 103, first through fourth active regions ACT1 through ACT4, first through sixth gate lines 121 through 126, first wiring lines 201 and 202, first contact structures 301 and 302, second wiring lines 311 and 312, a second contact structure 305, a first active region connecting structure 315, a second active region connecting structure 401, a third contact structure 307, and a third wiring line 317.

The second active region connecting structure 401 may be formed between the second and third active regions ACT2 and ACT3 and may electrically connect a transistor formed on the second active region ACT2 and a transistor formed on the third active region ACT3.

The third contact structure 307 may be formed on the second active region connecting structure 401, and the third wiring line 317 may be formed on the third contact structure 307. The second wiring lines 311 and 312 may be electrically connected to the third wiring line 317, as necessary, and signals transmitted along the fourth gate line 124 may be delivered to the third wiring line 317, as necessary.

Figure 8:
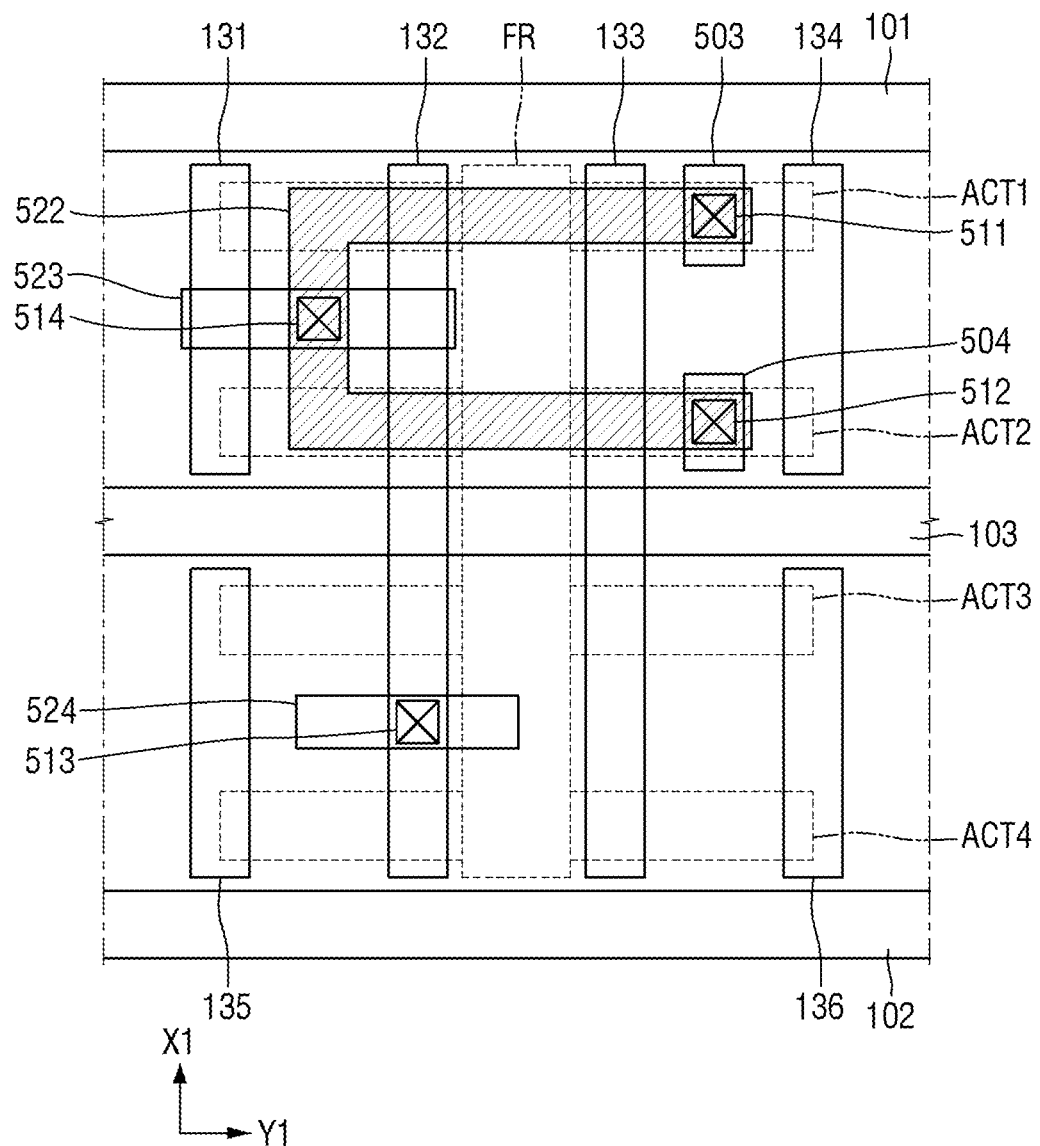
FIG. 8 is a layout view of a semiconductor device according to an example embodiment of the inventive concept.

FIG. 8 is a layout view of a semiconductor device according to an example embodiment of the inventive concept. The layout illustrated in FIG. 5 may be only a portion of the semiconductor device according to the present example embodiment. The example embodiment of FIG. 8 will hereinafter be described, focusing mainly on differences with the example embodiments of FIGS. 1, 6, and 7.

Referring to FIG. 8, the semiconductor device according to the present example embodiment includes first through third power rails 101 through 103, first through fourth active regions ACT1 through ACT4, seventh through twelfth gate lines 131 through 136, a field region FR, a third active region connecting structure 503, a fourth active region connecting structure 504, fifth contact structures 511, 512, 513, and 514, a fifth wiring line 522, and sixth wiring lines 523 and 524.

The eighth and ninth gate lines 132 and 133, which are dummy gate lines, may be used as routing channels for transmitting signals.

The field region FR may be formed between the eighth and ninth gate lines 132 and 133. The field region FR is a region for isolating transistors from one another.

The third active region connecting structure 503 may be formed on the first active region ACT1, and the fifth contact structure 511 may be formed on the third active region connecting structure 503.

The fourth active region connecting structure 504 may be formed on the second active region ACT2, and the fifth contact structure 512 may be formed on the fourth active region connecting structure 504.

The fifth wiring line 522 may be electrically connected to the fifth contact structures 511, 512, and 514 and may transmit signals between the transistors isolated by the field region FR. The sixth wiring line 523 may be formed on the fifth contact structure 514.

For example, the fifth contact structure 514 may serve as an input pin, and the fifth contact structures 511 and 512 may serve as output pins.

The fifth contact structure 513 may be formed on the eighth gate line 132, and the sixth wiring line 524 may be formed on the fifth contact structure 513.

Figure 9:
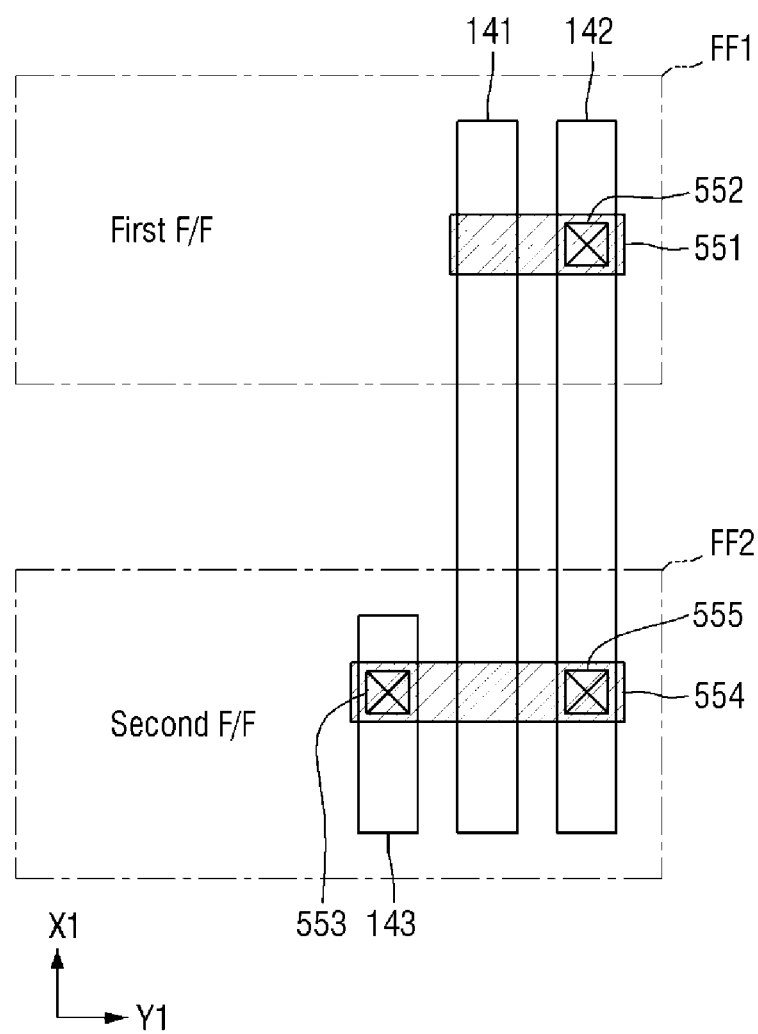
FIG. 9 is a layout view of a semiconductor device according to an example embodiment of the inventive concept.

FIG. 9 is a layout view of a semiconductor device according to an example embodiment of the inventive concept. The layout illustrated in FIG. 9 may be only a portion of the semiconductor device according to the present example embodiment.

Referring to FIG. 9, the semiconductor device according to the present example embodiment includes first and second flipflop circuits FF1 and FF2, thirteenth through fifteenth gate lines 141 through 143, sixth contact structures 552, 553, and 555, and seventh wiring lines 551 and 554.

The fourteenth gate line 142 may be used as a routing channel for transmitting signals between the first and second flipflop circuits FF1 and FF2. The sixth contact structure 552 and the seventh wiring line 551 may serve as input pins, and the sixth contact structures 553 and 555 and the seventh wiring line 554 may serve as output pins.

That is, according to the present example embodiment, a routing channel can be formed between a plurality of multi-height standard cells, such as, for example, a plurality of double-, triple-, or quadruple-height standard cells, by using a dummy gate line.

Figure 10:
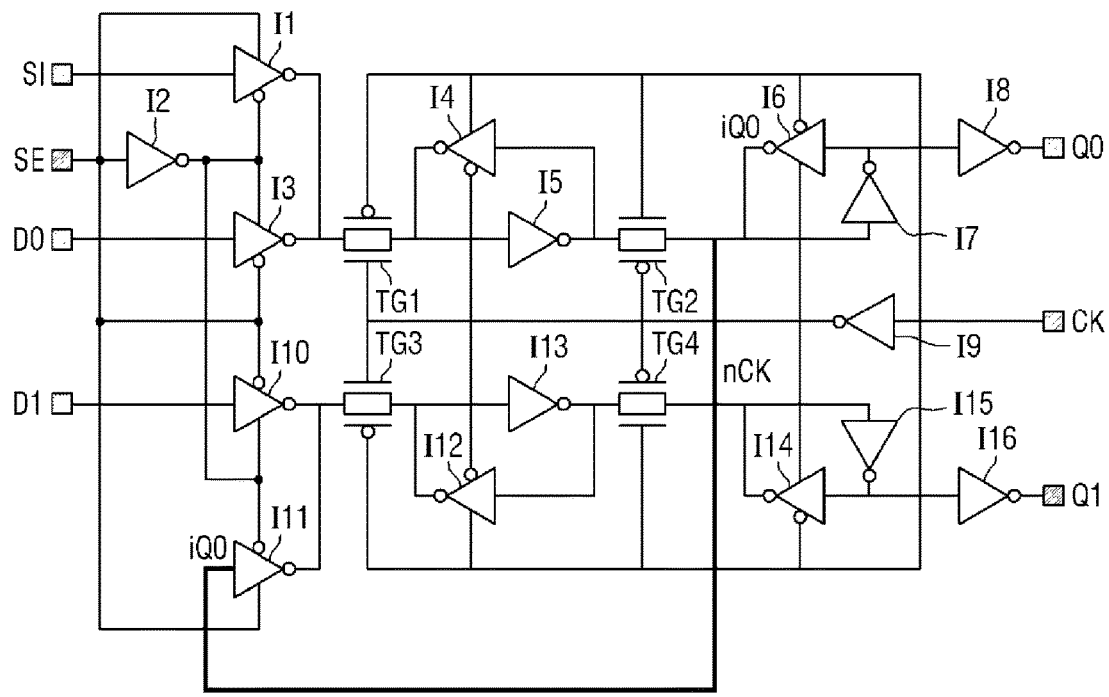
FIG. 10 is a circuit diagram of a semiconductor device, according to an example embodiment of the inventive concept.

FIG. 10 is a circuit diagram of a semiconductor device according to an example embodiment of the inventive concept.

More specifically, FIG. 10 illustrates a flipflop circuit having a single scan circuit.

Referring to FIG. 10, the semiconductor device according to the present example embodiment includes first through sixteenth buffers I1 through I16 and first through fourth transfer gates TG1 through TG4.

According to the present example embodiment, a channel for transmitting a scan input signal SI can be formed in a flipflop circuit having a single scan circuit by using a dummy gate line, as illustrated in FIG. 10. That is, a signal iQ0 output from the sixth buffer I6 may be input to the eleventh buffer I11, in which case, a dummy gate line formed on a chip level, e.g., the fourth gate line 124 shown in FIG. 5, can be used as a routing channel for transmitting the signal iQ0.

The aforementioned semiconductor devices according to the inventive concept are also applicable to a fin field effect transistor (FinFET) configuration, in which case, first through fourth active fins are formed in first through fourth active regions ACT1 through ACT4, respectively, to form the same structure as any one of the aforementioned semiconductor devices according to the inventive concept.

Example embodiments of the inventive concept have been described with reference to the accompanying drawings. However, those skilled in the art will appreciate that many variations and modifications can be made to the disclosed embodiments without substantially departing from the principles of the inventive concept. Therefore, the disclosed embodiments of the inventive concept are used in a generic and descriptive sense only and not for purposes of limitation.

What is claimed is:

1. A semiconductor device, comprising:
first through fourth active regions spaced apart from one another;
a first gate line disposed to overlap with the first and second active regions, but not with the third and fourth active regions, and to extend in a first direction;
a second gate line disposed to overlap with the third and fourth active regions, but not with the first and second active regions, and to extend in the first direction while being spaced apart from the first gate line; and
a dummy gate line disposed to overlap with the first through fourth active regions and a field region, to be spaced apart from the first and second gate lines in a second direction, which intersects the first direction, and to extend in the first direction,
wherein:
a first signal input to the first or second active region is transmitted to the third or fourth active region via the dummy gate line or a second signal input to the third or fourth active region is transmitted to the first or second active region via the dummy gate line, and
the first gate line, the second gate line, and the dummy gate line are formed on a top surface of a substrate.

2. The semiconductor device of claim 1, wherein:
first and second standard cells are defined in the semiconductor device,
the first standard cell includes the first and second active regions, and
the second standard cell includes the third and fourth active regions.

3. The semiconductor device of claim 1, further comprising:
a first contact structure formed on the dummy gate line in a region including the first and second active region; and
a first wiring line formed on the first contact structure to be electrically connected to the first contact structure.

4. The semiconductor device of claim 3, further comprising:
a second contact structure formed on the dummy gate line in a region including the third and fourth active region; and
a second wiring line formed on the second contact structure to be electrically connected to the second contact structure.

5. The semiconductor device of claim 1, wherein the first and second active regions are spaced apart from each other in the first direction.

6. The semiconductor device of claim 1, wherein the first and second gate lines are spaced apart from each other in the first direction.

7. The semiconductor device of claim 1, wherein
the first active region includes a first P-type impurity doped region, and
the second active region includes a first N-type impurity doped region.

8. The semiconductor device of claim 7, wherein
the third active region includes a second N-type impurity doped region, and
the fourth active region includes a second P-type impurity doped region.

9. The semiconductor device of claim 1, wherein
the first active region includes a first N-type impurity doped region, and
the second active region includes a first P-type impurity doped region.

10. The semiconductor device of claim 9, wherein
the third active region includes a second P-type impurity doped region, and
the fourth active region includes a second N-type impurity doped region.

11. The semiconductor device of claim 1, wherein a first distance between the first gate line and the dummy gate line in the second direction is the same as a second distance between the second gate line and the dummy gate line in the second direction.

12. The semiconductor device of claim 1, wherein the first or second signal includes a scan input signal.

13. A semiconductor device, comprising:
a first buffer including a first N-type metal oxide semiconductor (NMOS) transistor and a first P-type metal oxide semiconductor (PMOS) transistor;
a second buffer including a second NMOS transistor and a second PMOS transistor; and
a dummy gate line electrically connecting an output terminal of the first buffer and an input terminal of the second buffer,
wherein:
a first signal output from the output terminal of the first buffer is input to the input terminal of the second buffer via the dummy gate line, and
the first NMOS transistor, the first PMOS transistor, the second NMOS transistor, the second PMOS transistor, and the dummy gate line are formed on a top surface of a substrate.

14. The semiconductor device of claim 13, wherein
the first NMOS transistor includes a first gate line,
the first PMOS transistor includes a second gate line, and
the dummy gate line and the first and second gate lines are included in a same layer on the substrate.

15. The semiconductor device of claim 14, wherein
the second NMOS transistor includes a third gate line,
the second PMOS transistor includes a fourth gate line, and
the dummy gate line and the third and fourth gate lines are included in the same layer on the substrate.

16. The semiconductor device of claim 13, wherein
the first and second buffers form a single scan circuit, and
the first signal includes a scan input signal.

17. A semiconductor device, comprising:
a first flipflop circuit including a first standard cell having a first height;
a second flipflop circuit including a second standard cell having a second height; and
a dummy gate line electrically connecting the first flipflop circuit and the second flipflop circuit,
wherein:
a first signal output from the first flipflop circuit is input to the second flipflop circuit via the dummy gate line, and
the dummy gate line, transistors included in the first flipflop circuit, and transistors included in the second flipflop circuit are arranged in a single layer formed horizontally on a top surface of a substrate.

18. A semiconductor device comprising:
a plurality of active regions each of which comprises at least one transistor; and
a dummy gate line which does not form a transistor, and connects a first active region and a second active region of the active regions so that a signal output from the first active region is input to the second active region through the dummy gate line,
wherein the dummy gate line is formed in or abut onto a field region which separates the active regions from one another.

19. The semiconductor device of claim 18, wherein the dummy gate line is disposed at an end portion of the first and second active regions.

20. The semiconductor device of claim 19, wherein the dummy gate line and a plurality of gate lines forming transistors of the active regions are formed commonly on a top or bottom surface of a substrate of the semiconductor device.

* * * * *